Figure 1:
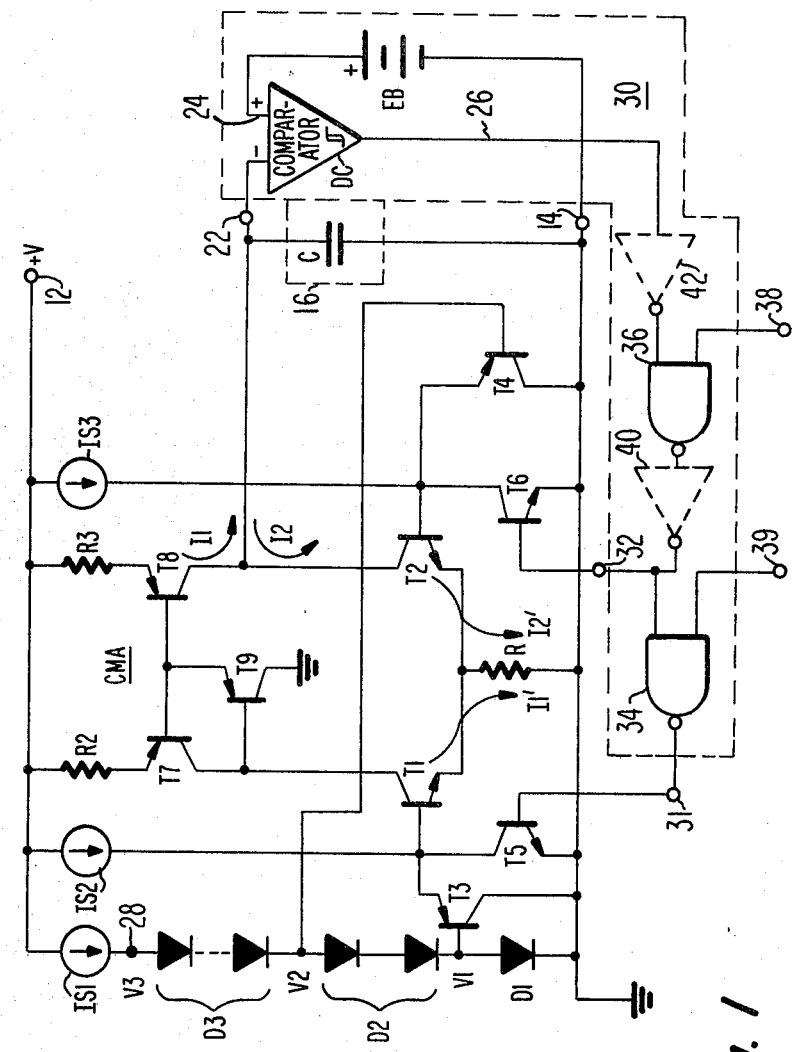

United States Patent [19]

Steckler et al.

[11] Patent Number: 4,471,326

[45] Date of Patent: Sep. 11, 1984

[54] CURRENT SUPPLYING CIRCUIT AS FOR AN OSCILLATOR

[75] Inventors: Steven A. Steckler, Clark; Alvin R. Balaban, Lebanon, both of N.J.

[73] Assignee: RCA Corporation, New York, N.Y.

[21] Appl. No.: 259,359

[22] Filed: Apr. 30, 1981

[51] Int. Cl.³ .............................................. H03K 3/282
[52] U.S. Cl. .............................. 331/111; 331/108 A; 307/228; 323/326; 330/207 P
[58] Field of Search ............... 331/111, 108 A, 108 R, 331/108 D, 108 C, 113 R; 307/228, 496, 500, 503, 276, 288; 330/86, 207 P; 323/326, 349, 350, 353, 283, 290; 358/159; 363/133

[56] References Cited

U.S. PATENT DOCUMENTS

| | | | |
|---|---|---|---|
| 3,418,490 | 12/1968 | Hofferber | 307/228 X |
| 3,441,864 | 4/1969 | Hafler | 330/11 |
| 3,539,834 | 11/1970 | Stopper | 307/254 |
| 3,556,088 | 2/1971 | Crook | 330/110 X |
| 3,618,131 | 11/1971 | Garde | 331/113 |
| 3,624,426 | 11/1971 | Saari | 307/297 |
| 3,683,270 | 8/1972 | Mattis | 323/4 |
| 3,730,989 | 5/1973 | Rhee | 358/159 |
| 3,772,533 | 11/1973 | Bruckner et al. | 307/228 X |
| 3,805,170 | 4/1974 | Dusheck, Jr. | 330/110 X |
| 3,883,756 | 5/1975 | Dragon | 307/228 X |
| 3,899,744 | 8/1975 | Kominami | 330/30 D |
| 3,904,951 | 9/1975 | Gersbach | 323/4 |
| 3,924,202 | 12/1975 | Craft | 331/111 |
| 3,982,172 | 9/1976 | van de Plassche | 323/1 |
| 4,057,767 | 11/1977 | Laupman | 330/207 |
| 4,104,575 | 8/1978 | Bauer | 323/4 |
| 4,119,869 | 10/1978 | Hashimoto | 307/296 R |
| 4,140,960 | 2/1979 | Ohsawa | 323/349 |
| 4,316,155 | 2/1982 | Hanisko | 328/127 |

FOREIGN PATENT DOCUMENTS

| | | | |
|---|---|---|---|
| 11899 | 7/1980 | European Pat. Off. | 307/228 |
| 44-12645 | 6/1969 | Japan | 307/228 |
| 54-8449 | 1/1979 | Japan | 307/228 |
| 55-50733 | 4/1980 | Japan | 307/228 |
| 56-1617 | 1/1981 | Japan | 331/111 |
| 1367659 | 11/1972 | United Kingdom . | |

OTHER PUBLICATIONS

Anon., "µA734", Fairchild Linear Integrated Circuits Data Book, Copyright 1976, pp. 9–26.
Zapf, J. et al, "Design for an Economical Protected-Circuit 20-200W Amplifier", Funkschau, Dec. 2, 1977, vol. 49, No. 25, pp. 1202–1206.
Anon., "µA723 Precision Voltage Regulator", Fairchild Linear Integrated Circuits Data Book, Copyright 1976, pp. 1421–1427.
Linear Applications Handbook, National Semiconductor, 1978, pp. 1, AN125-6 through AN125-7.
T. R. Mills, "A Five Function IC for Television Receivers", IEEE Transactions on Broadcast and Television Receivers, Oct. 1969, pp. 277–283.

Primary Examiner—Siegfried H. Grimm
Assistant Examiner—W. R. Paxman
Attorney, Agent, or Firm—E. M. Whitacre; P. J. Rasmussen; C. A. Berard, Jr.

[57] ABSTRACT

A circuit for supplying first and second currents to a load comprises two current generators for providing those currents during first and second time intervals and a resistance through which those currents flow. Two control potentials developed by two semiconductor junctions are applied across the resistance. First and second control circuits control the two current generators so that the first and second currents are provided during the first and second time intervals, respectively. The current supply circuit is useful in a multivibrator wherein the timing capacitor thereof is the load to which the first and second currents are supplied.

14 Claims, 5 Drawing Figures

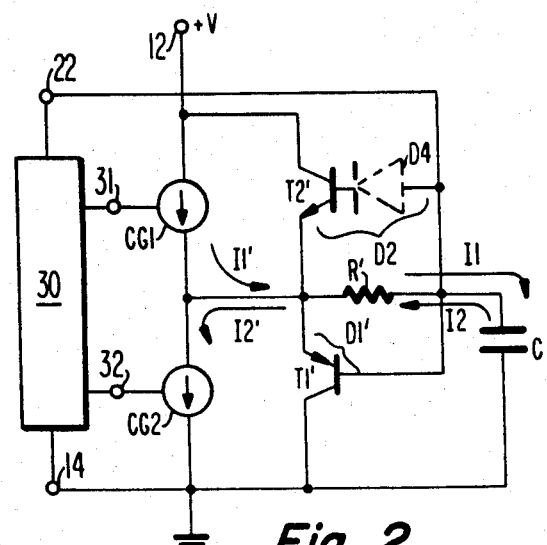
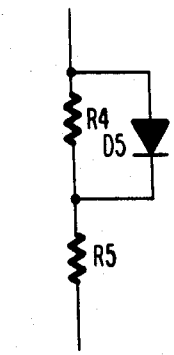
Fig. 4
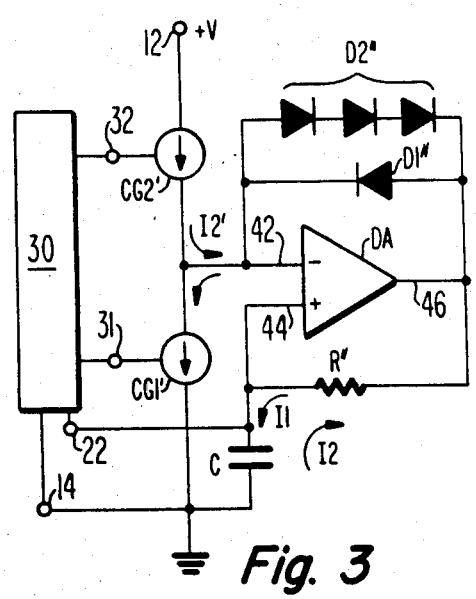
Fig. 2
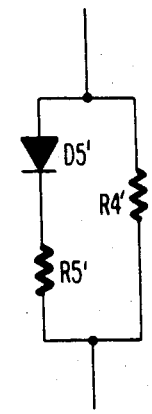
Fig. 5
Fig. 3

CURRENT SUPPLYING CIRCUIT AS FOR AN OSCILLATOR

The present invention relates to current supplying circuits and, more particularly, to those which supply a plurality of different currents at different times.

Current supplies of the sort described herein are particularly useful for supplying charging and discharging currents to a capacitor so as to develop a sawtooth potential thereacross. Sawtooth wave generators are employed, for example, for generating precisely controlled voltage and current wave-forms in the horizontal deflection circuit of a television receiver. U.S. Pat. Application Ser. No. 102,575 entitled PULSE GENERATOR FOR A HORIZONTAL DEFLECTION SYSTEM filed by the present inventors on Dec. 11, 1979, now U.S. Pat. No. 4,282,549, assigned to the same assignee as is the present invention, and incorporated herein by reference, describes such horizontal deflection systems.

To obtain currents of opposite polarity sense, such as charging and discharging currents for a capacitor, one can employ a current mirror amplifier (CMA) to obtain the necessary polarity inversion. Where the ratio of the magnitudes of the charging and discharging currents is far different from unity, a CMA with a current gain ratio far different from unity would be required. So that a precise ratio of the magnitudes of the charging and discharging currents can be readily achieved, it is desirable to avoid CMA's with current ratios far different from unity because they can introduce substantial current magnitude errors and can be difficult to produce with the necessary accuracy.

Current supplying circuits according to the present invention avoid the necessity for CMA's having current gain ratios far different from unity. The present current supplying circuit comprises a load to which first and second currents are to be supplied, a resistance through which the first and second currents flow, and first and second current generators controlled for respectively producing the first and second currents during first and second time intervals. First and second semiconductor junctions develop respective first and second control potentials which are applied across the resistance during the first and second time intervals by first and second control devices, respectively. The first and second control devices control the first and second current generators to provide the first and second currents during the first and second time intervals, respectively.

In the drawings:

FIG. 1, partly in block form and partly in schematic diagram form, shows a multivibrator employing an embodiment of the present invention;

FIGS. 2 and 3, partly in block form and partly in schematic diagram form, show alternative embodiments of the present invention; and FIGS. 4 and 5 show modifications of the embodiments of FIGS. 1-3.

A current supplying circuit included in the multivibrator in FIG. 1 receives relatively positive operating potential +V at supply terminal 12, receives relatively negative operating potential at supply terminal 14 and supplies first and second currents I1 and I2 to load 16, shown by way of example as capacitance C. The operating potential at terminal 14 may be a reference potential such as ground. Control potentials V1, V2 and V3 are developed across semiconductor junctions, shown by way of example as diodes D1, D2 and D3. Those control potentials are developed in response to a current supplied to the serial connection of D1, D2 and D3 by current source IS1. Whereas diode element D1 is shown by way of example as a single diode, elements D2 and D3 are shown by way of example as a plurality of series-connected diodes to illustrate that the control potentials can be any selected potential between operating potential +V and ground.

Current I1 is developed as follows. Assume that NPN transistor T5 is nonconductive and that NPN transistor T6 is conductive thereby connecting the base of NPN transistor T2 to ground at terminal 14. Control potential V1 is applied to the base of NPN transistor T1 by the emitter-follower action of PNP transistor T3 which receives quiescent emitter current from current source IS2, and operating potential as its collector from reference potential at ground 14. T1 functions as an emitter-follower amplifier applying control potential V1 across resistance R. Because T1 and T3 are of complementary conductivity types, the sum of their base-emitter conduction potentials is approximately zero so that the potential across resistance R is substantially control potential V1. In response, current I1' flows through resistance R.

With respect to current I1', transistor T1 functions as a common-base amplifier receiving current I1' at its emitter and supplying that current through its collector to the current mirror amplifier (CMA) formed by PNP transistors T7, T8 and T9. T7 is the input or master transistor of the CMA while T8 is the output or slave transistor thereof. T9 is an emitter-follower amplifier which applies a potential responsive to the collector potential of T7 to the respective bases of T7 and T8 to condition them for conduction. T9 serves to substantially reduce errors in the ratio of output current to input current of the CMA that could otherwise be introduced because the base currents of T7 and T8 may not be insignificantly small with respect to their collector currents. So that the current ratio of CMA can be more precisely determined, resistances R2 and R3 are connected to the emitters of T7 and T8, respectively. Thus, current I1 supplied by T8 is directly proportional to the current I1' flowing in resistance R in response to control potential V1.

Current I2 is developed as follows. Assume that transistor T6 is nonconductive and that T5 is conductive thereby connecting the base of T1 to ground potential at terminal 14. PNP transistor T4 functions as an emitter-follower amplifier receiving control potential V2 at its base, zoperating current from current source IS3 at its emitter, and reference potential at its collector in similar manner to that described above with respect to T3. NPN transistor T2 functions as an emitter-follower amplifier with respect to the control potential at the emitter of T4 and applies control potential V2 from its emitter to resistance R. Because T2 and T4 are of complementary conductivity types, the sum of their base-emitter conduction potentials is approximately zero so that the potential across resistance R is substantially equal to control potential V2.

Current I2' flows through resistance R in response to control potential V2 applied thereacross. Transistor T2 functions as a common-base amplifier in response to current I2' received at its emitter and supplies current I2 to load 16 from its collector.

Transistors T5 and T6 are rendered conductive at different times as follows owing to the operation of circuit 30. Circuit 30 is shown by way of example as including NAND (Negative AND) gate 34 and AND gate 36. Unless otherwise specified hereinafter, a HIGH level is assumed to be applied at terminal 38 so that HIGH and LOW levels from circuit point 26 cause AND gate 36 to develop HIGH and LOW levels, respectively, at node 32. Similarly, a HIGH level is assumed to be applied at terminal 39 so that HIGH and LOW levels from node 32 cause NAND gate 34 to develop LOW and HIGH levels, respectively, at node 31. For purposes of the immediately following description, inverters 40 and 42, shown in phantom, are to be ignored.

When AND gate 36 applies a LOW level to control node 32, transistor T6 is nonconductive. The LOW level at control node 32 is inverted to a HIGH level at control node 31 by NAND gate 34 to render T5 conductive. On the other hand, when AND gate 36 applies a HIGH level to control node 32 to render T6 conductive, NAND gate 34 applies a LOW level at control node 31 to render T5 nonconductive. It is to be understood that a LOW level is used to indicate a signal that does not cause the base-emitter potential of a transistor, such as T5 or T6, to reach sufficient magnitude as to cause that transistor to become conductive. Generally, ground potential is satisfactory as the LOW level. A HIGH level on the other hand is used to indicate a signal that develops sufficient base-emitter potential on either T5 or T6 to render it conductive, i.e. greater than about 0.6 to 0.7 volts.

Transistor T5 thus operates to connect the base of T1 selectively to either a source of control potential V1 or to reference potential at terminal 14 when T5 is nonconductive and conductive, respectively. It is noted that when T5 is conductive, the base of T1 and the emitter of T3 are both connected to ground potential whereby neither T1 nor T3 can receive sufficient base-emitter potential to become conductive. In like manner, T6 serves to connect the base of T2 selectively between control potential V2 and ground. T2 and T4 are both rendered nonconductive when T6 is conductive in like manner to that described above in relation to T1, T3 and T5.

It is noted that the circuit of FIG. 1 avoids the necessity of employing a CMA with a current gain ratio that is substantially different from unity because control potentials V1 and V2 can be in precise ratio different from unity. For example, V1 is equal to the forward conduction potential of a single diode D1 while V2 is equal to three such potentials from D1 and D2, so that V1 and V2 are in 1:3 ratio. By employing diodes of like construction for D1 and D2, and because they are serially-connected to receive substantially identical operating current, extremely precise ratios of control potentials can obtain.

The remainder of the circuit 30 of FIG. 1 completes a multivibrator including the current supplying circuit thus far described. Differential comparator DC receives at input connection 24 a control potential shown by way of example as the potential of battery EB. Comparator DC receives the potential across load 16 at its other input connection 22. When the potential at input connection 22 exceeds that at 24 by a first predetermined amount, comparator DC output connection 26 applies a LOW level to AND gate 36. Thereafter, when the potential at input connection 22 decreases below that at 24 by a second predetermined amount, comparator DC output connection 26 applies a HIGH level to AND gate 36.

Operation of the circuit of FIG. 1 as an astable multivibrator, gated by the level at terminal 38, is as follows. Assume as a starting point that capacitor C is initially discharged and that a LOW level is applied to AND gate 36 at terminal 38. Thus, T5 is conductive, T6 is nonconductive, and comparator output connection 26 applies a HIGH level to AND gate 36. Operation is initiated by applying a HIGH level at terminal 38 (a HIGH level already is applied at terminal 39). At that time, AND gate 36 applies a HIGH level to control node 32 so that T6 becomes conductive and T5 becomes nonconductive. As a result, the current supplying circuit supplies charging current I1 to capacitor C. When capacitance C has charged to a first predetermined level exceeding the potential of EB, differential comparator DC responds by applying a LOW level to AND gate 36 which then causes T5 to become conductive and T6 to become nonconductive. As a result, T2 conducts discharge current I2 from capacitor C. When capacitor C has discharged to a second determined level falling below the potential of EB, differential comparator DC responds by again applying a HIGH level to AND gate 36 and the afore-described cycle repeats, so long as terminals 38 and 39 are maintained at HIGH levels.

The multivibrator circuit of FIG. 1 may also be employed to generate sawtooth potential wave-shapes across capacitance C in response to externally developed signals which determine the charge and discharge time, respectively, of capacitance C. This can be accomplished as follows. To begin the charging of capacitor C, the level applied at terminal 38 is changed from a LOW to a HIGH level thereby enabling transistor T1 to supply current I1 as described above. When the desired timing period has elapsed, the level at terminal 38 is changed from a HIGH to a LOW level thereby causing transistor T2 to supply current I2 as described above to discharge capacitance C. Because the ratio of currents I1 to I2 is precisely controlled, the ratio of the charge and discharge time periods of C is likewise precisely controlled. It is understood that the circuit of FIG. 1 functions as a monostable multivibrator where the HIGH to LOW level change at terminal 38 referred to above is made to occur during the time interval in which capacitance C is being discharged. That can be accomplished, for example, by making the HIGH to LOW level change at terminal 38 responsive to the HIGH to LOW level change at circuit point 26 which occurs when the potential at input connection 22 of comparator DC exceeds the first predetermined level.

It is further understood that transistors T1 and T2 can both be made nonconductive so that neither I1 nor I2 is supplied. When a LOW level is applied at terminal 39, a HIGH level is developed at node 31 so that current I1 is not developed. That is so irrespective of the level developed at node 32.

Inverters 40 and 42, shown in phantom, are added to circuit 30 so that current I2 is not developed when terminal 38 is LOW. When a LOW level is applied at terminal 38, AND gate 36 develops a LOW level at its output terminal, which level becomes a HIGH level at node 32 owing to the operation of inverter 40. Thus, T6 is conductive and I2 is not developed by T2. Inverter 42 is included to maintain the same number of inversions between 26 and 32, with respect to signals passing therebetween, as if inverters 40 and 42 had not been added. This particular arrangement is useful in a television horizontal deflection system where it is desired to develop a waveform across capacitance C which holds a substantially constant level for certain periods of time. For example, the potential across capacitance C can be made to increase by charging C to a first predetermined level. When that first level is attained, LOW levels can be applied to terminals 38 and 39 responsive to the HIGH to LOW level change at circuit point 26 so that the potential across C is held at the first level. Thereafter, C can be discharged by applying a HIGH level at 38 until C is discharged to a second predetermined level. At that time, LOW levels can be applied to terminals 38 and 39 responsive to the LOW to HIGH level change at 26, so that the potential across C is then held at the second level.

In the circuit of FIG. 2, current generators CG1 and CG2 respectively supply currents I1' and I2' at different times in response to signals applied at control nodes 31 and 32, respectively. When current I1' is supplied, a portion thereof flows through resistance R' and capacitance C as current I1. The potential produced across resistor R' by current I1 is limited by the base-emitter potential of PNP transistor T1'. Thus, in effect, the base-emitter potential of PNP transistor T1' serves as the control potential applied across resistance R' to determine the value of current I1 so that T1' functions as a regulator of current I1. If current I1 tends to exceed the predetermined value $V_{BE-T1'}/R'$, then T1 becomes more conductive so that a lesser portion of current I1' flows through R' and C. Conversely, if current I1 tends to decrease below that predetermined value, T1' tends to become less conductive so that a greater portion of I1' flows through R' and C. The excess of current I1' over I1 flows to ground at terminal 14 via the collector of T1'. As a result, the value of I1 is controlled to a predetermined value.

When I2' is supplied by current generator CG2, a portion thereof flows through resistance R' and capacitance C as current I2 with polarity sense opposite to that described for current I1. Current I2 is established at a predetermined value of $V_{BE-T2'}/R'$ by NPN transistor T2' so that T2' functions as a regulator of current I2. That is accomplished by T2' becoming more or less conductive to decrease or increase the portion of current I2' flowing through resistor R' and C in an analogous manner to that just described with respect to transistor T1'. The excess of current I2' over I2 flows from supply terminal 12 via the collector of T2'. As a result, the magnitude of I2 is controlled to a predetermined value. Diode D4, shown in phantom, will be explained later.

In the current supplying circuit of FIG. 3, differential-input amplifier DA replaces transistors T1' and T2' of FIG. 2 to perform the function of maintaining currents I1 and I2 at respective predetermined values. Degenerative feedback between output connection 46 of amplifier DA and inverting input connection 42 thereof causes the potential at noninverting input connection 44 of amplifier DA to be at substantially the same potential as is inverting connection 42. That degenerative feedback connection is completed at different times through diode element D1" when current I1' is supplied and through diode element D2" when current I2' is supplied. Because the potentials at input connections 42 and 44 of amplifier DA are substantially identical, the magnitude of current I1 is determined by the conduction potential of diode D1" divided by the resistance R". Similarly, the magnitude of current I2 is determined by the conduction potential of diode element D2", shown by way of example as a plurality of serially-connected diodes, divided by the value of resistance R".

Circuit 30 shown in FIGS. 2 and 3 completes a multivibrator of the sort described above in relation to FIG. 1 and can be, for example, of like structure to that of FIG. 1.

The resistor-diode network of FIG. 4 is a modification that can be substituted in place of resistance R in the embodiment of FIG. 1. When the modification of FIG. 4 is substituted in the circuit of FIG. 1, it exhibits different resistance at the different times when currents I1 and I2 are supplied, i.e. when currents I1' and I2' flow through it. When current I1 is supplied, control potential V1 is supplied across the network of FIG. 4. But that control potential V1 is of insufficient magnitude to cause diode D5 to become conductive owing to the voltage division action of serially connected resistors R4 and R5. In that instance, the resistance exhibited is equal to (R4+R5). When current I2 is supplied, however, sufficient potential is applied across the network of FIG. 4 to cause diode D5 to become conductive so that current I2' is determined by control potential V2 less the forward conduction potential of D5 divided by the value of resistance R5. It is noted that the circuit of FIG. 4 is also satisfactorily substituted for resistances R' and R" in the circuits of FIGS. 2 and 3, respectively. That is so even where the control potentials applied to the resistance R' or R" reverse polarity between the time intervals during which currents I1 and I2 are generated, respectively. In fact, the circuit of FIG. 4 exhibits the aforementioned different resistances so long as diode D5 is conductive when one current is supplied and is nonconductive when the other current is supplied.

It is noted that the circuits of FIGS. 2 and 3 completely avoid the use of a CMA and, therefore, the attendant errors that could be introduced even though the CMA current ratio could be close to unity and its error small. The circuits of FIGS. 1 and 3 are particularly advantageous when constructed as an integrated circuit because the diodes, which produce the control potentials from which the values of the respective currents I1 and I2 are determined, can be fabricated simultaneously by the same production process. Moreover, they can be comprised of like elements such as diode-connected transistors. As a result, minimum differences in the ratio of the control potentials, and, therefore, of the value of the currents I1 and I2, will obtain.

In a circuit constructed, resistors R2 and R3 were 2.0 kilohms and 0.8 kilohms, respectively, and transistors T7 and T8 were constructed with respective emitter-junction areas in ratio of 1:2 so that CMA exhibited an output to input current ratio of about 1.5. Capacitance C was 2200 picofarads. The circuit of FIG. 4 was employed in place of resistance R, and resistors R4 and R5 were each 2.2 kilohms. With those particular values, the current supplying circuit produced a capacitor charging time of about 24 microseconds (during which I1 flows) and a discharging time of about 9 microseconds (during which I2 flows). Those times are satisfactory when the multivibrator is used as a monostable multivibrator in the horizontal deflection system of the television receiver. In that application, one cycle of multivibrator operation is desired for each horizontal line of the television picture, each line being 63.5 microseconds in duration.

Modifications of the present invention as defined by the following claims are contemplated. For example, in FIG. 1, the control potential at input connection 24 of comparator DC can be provided by a direct connection between input connection 24 and potential V3 at node 28. Further, in FIG. 2, diode D4, shown in phantom, can be connected in series with the base-emitter junction of transistor T2' so that the magnitude of I2 is greater than that of I1. The sum of respective forward conduction potentials then serves as a control potential for determining current I2, i.e., T2' and D4 together serve as the equivalent of diode element D2'.

Still further, the circuit of FIG. 5 may be employed as a modification in any of the current supplying circuits of FIG. 1–3 in like manner to that described herein in relation to the modification of FIG. 4. The circuit of FIG. 5 exhibits resistance R4' when diode D5' is non-conductive and exhibits a lesser resistance when D5' is conductive to effectively connect resistor R5' in parallel with R4'.

What is claimed is:

1. A current supplying circuit comprising:
   a load having a terminal to which first and second load currents are to be supplied;
   resistance means, having first and second terminals, through which currents that determine said first and second load currents flow;
   means for providing first and second control potentials, wherein said second control potential is substantially different in magnitude than said first control potential, said means for providing including:
   a plurality of serially connected semiconductor junctions, and means for applying current to said junctions for biasing said junctions to develop said first and second control potentials across first and second combinations of said junctions respectively;
   first and second transistors of like conductivity type, having respective common electrodes coupled to the first terminal of said resistance means, having respective input and output electrodes, and having, respectively, first and second input circuits between said input electrodes and the second terminal of said resistance means, wherein said first input circuit includes a third transistor of complementary conductivity type to said first transistor, said third transistor having an input electrode coupled to said first control potential, a common electrode connected to the input electrode of said first transistor and an output electrode coupled to the second terminal of said resistance means and to a point of operating potential, and wherein said second input circuit includes a fourth transistor of complementary conductivity type to said second transistor, said fourth transistor having an input electrode coupled to said second control potential, a common electrode connected to the input electrode of said second transistor and an output electrode coupled to the second terminal of said resistance means and to said point of operating potential;
   control means for applying a reference potential to the input electrode of said second transistor during a first time interval, rendering said second transistor non-conductive while allowing said first control potential to be applied to the first terminal of said resistance means through said first input circuit and said first transistor to develop said current that determines said first load current in said first transistor and said resistance means during said first time interval, and for applying said reference potential to the input electrode of said first transistor during a second time interval, rendering said first transistor non-conductive while allowing said second control potential to be applied to the first terminal of said resistance means through said second transistor to develop said current that determines said second load current in said second transistor and said resistance means during said second time interval;
   means coupled to said output electrodes of said first and second transistors for receiving substantially said currents that determine said first and second load currents, and coupled to said load terminal for supplying said first and second load currents thereto.

2. The current supplying circuit of claim 1 wherein said means coupled to said output electrodes of said first and second transistors includes current amplifying means having a gain factor close to unity and having an input circuit for receiving input current from the output electrode of one of said first and second transistors, and having an output circuit for supplying current proportional to said input current by said gain factor to said load.

3. The current supplying circuit of claim 1 wherein said load includes a capacitance for being charged by said first load current and for being discharged by said second load current, and further comprising:
   comparator means for determining said first and second time intervals including:
   means responsive to said capacitance being charged to a first predetermined level to terminate said first time interval and initiate said second time interval, and responsive to said capacitance being discharged to a second predetermined level to terminate said second time interval and initiate said first time interval.

4. The current supplying circuit of claim 1 wherein said resistance means exhibits a first resistance value when said first control potential is applied thereto and exhibits a second resistance value when said second control potential is applied thereto.

5. The current supplying circuit of claim 4 wherein said resistance means includes diode means connected in parallel with at least a portion of said resistance means.

6. The current supplying circuit of claim 5 wherein said resistance means further includes a further resistance serially connected with said diode means.

7. A current supplying circuit comprising:
   a load to which first and second load currents are to be supplied;
   first and second current generating means controlled for respectively supplying first and second input currents during first and second time intervals;
   resistance means coupled at a first terminal to said first and second current generating means and at a second terminal to said load, and through which said first and second load currents flow;
   control means for regulating the magnitudes of said first and second load currents during said first and second time intervals including:
   first and second transistors of complementary conductivity types, each having base, emitter, and collector electrodes;

means connecting the emitter and base electrodes of said first transistor to the first and second terminals of said resistance means, respectively;

means connecting the emitter and base electrodes of said second transistor to the first and second terminals of said resistance means, respectively; and means coupling the collector electrodes of said first and second transistors to first and second sources of operating potential respectively.

8. The current supplying circuit of claim 7 wherein respective first terminals of said first and second current generating means connect to the first terminal of said resistance means, and wherein said control means includes:

means connecting the collector electrode of said first transistor to a second terminal of said second current generating means, and means connecting the collector electrode of said second transistor to a second terminal of said first current generating means.

9. A current supplying circuit comprising:

a load to which first and second load currents are to be supplied;

first and second current generating means controlled for respectively supplying first and second input currents during first and second time intervals;

resistance means coupled at one terminal to said load and through which said first and second load currents flow;

control means for regulating the magnitudes of said first and second load currents during said first and second time intervals including:

first and second semiconductor junction means each having an anode terminal and a cathode terminal;

differential-input amplifying means having inverting input and non-inverting input connections, and having an output connection;

means for coupling said first and second semiconductor junction means in parallel, the anode terminal of said first junction means being coupled to the cathode terminal of said second junction means, said parallelly coupled junction means being coupled between said inverting input connection and said output connection for producing first and second control potentials therebetween;

means for coupling respective first terminals of said first and second current generating means to said inverting input connection; and means for coupling said one terminal of said resistance means to said non-inverting input connection and for coupling the other terminal of said resistance means to said output connection.

10. The current supplying circuit of claim 9 wherein at least one of said first and second semiconductor junction means comprises a number of serially connected semiconductor diodes said number being selected so that said first and second load currents have different predetermined magnitudes.

11. The current supplying circuit of claim 7 or 9 wherein said load includes a capacitance for being charged by said first load current and for being discharged by said second load current, and further comprising:

comparator means for determining said first and second time intervals including:

means responsive to said capacitance being charged to a first predetermined level for controlling said first current generating means to not supply said first input current and for controlling said second current generating means to supply said second input current, and means responsive to said capacitance being discharged to a second predetermined level for controlling said first current generating means to supply said first input current and for controlling said second current generating means to not supply said second input current.

12. The current supplying circuit of claim 7 or 9 wherein said resistance means exhibits a first resistance value when said first load current flows therethrough and exhibits a second resistance value when said second load current flows therethrough.

13. The current supplying circuit of claim 12 wherein said resistance means includes diode means connected in parallel with at least a portion of said resistance means.

14. The current supplying circuit of claim 13 wherein said resistance means further includes a further resistance serially connected with said diode means.

* * * * *